(12) United States Patent
Tang et al.

(10) Patent No.: US 7,061,806 B2
(45) Date of Patent: Jun. 13, 2006

(54) FLOATING-BODY MEMORY CELL WRITE

(75) Inventors: Stephen H. Tang, Pleasanton, CA (US);
Ali Keshavarzi, Portland, OR (US);
Dinesh Somasekhar, Portland, OR (US);
Fabrice Paillet, Hillsboro, OR (US);
Muhammad M. Khellah, Tigard, OR (US);
Yibin Ye, Portland, OR (US);
Shih-Lien L. Lu, Portland, OR (US);
Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 125 days.

(21) Appl. No.: 10/954,931

(22) Filed: Sep. 30, 2004

(65) Prior Publication Data
US 2006/0067126 A1   Mar. 30, 2006

(51) Int. Cl.
*G11C 11/34* (2006.01)
(52) U.S. Cl. .............................. 365/185.18; 365/185.28
(58) Field of Classification Search .......... 365/185.18, 365/185.28, 185.24
See application file for complete search history.

(56) References Cited

U.S. PATENT DOCUMENTS 6,714,436 B1 * 3/2004 Burnett et al. ............... 365/149
6,852,524 B1 * 2/2005 Okamura et al. ........ 435/287.1
6,873,539 B1 * 3/2005 Fazan et al. ................. 365/149

OTHER PUBLICATIONS

Ohsawa, Takashi et al "Memory Design Using One-Transistor Gain Cell on SOI", ISSCC 2002, Session 9, Dram and Ferroelectric Memories, 9.1, Feb. 5, 2002. 3 pgs.

* cited by examiner

*Primary Examiner*—Vu A. Le
(74) *Attorney, Agent, or Firm*—Buckley, Maschoff & Talwalkar LLC

(57) ABSTRACT

A system to write to a plurality of memory cells coupled to a word line, each of the plurality of memory cells comprising a transistor having a source, a drain, a body and a gate coupled to the word line. Some embodiments provide biasing of one or more of the plurality of memory cells in saturation to inject charge carriers into the body of the one or more of the plurality of memory cells, and biasing of each of the plurality of memory cells in accumulation to tunnel charge carriers from the body of each of the plurality of memory cells to the gate of each of the plurality of memory cells.

12 Claims, 10 Drawing Sheets

FLOATING-BODY MEMORY CELL WRITE

BACKGROUND

Conventional electronic memories may be implemented by arrays of discrete memory cells. Many types of memory cells currently exist. Each type of memory cell may be associated with one or more methods for writing a value and reading a stored value.

FIG. 1 shows a cross-sectional view of floating-body dynamic random access memory (FBDRAM) memory cell 1. Cell 1 comprises a single transistor fabricated upon p-type substrate 2 and n-type well 3. The transistor includes n+-type source 4, p-type body 5 and n+-type drain 6. Oxide 7 is disposed over body 5 and gate 8 overlays oxide 7.

The value stored by cell 1 is determined by a concentration of charge carriers within body 5. Accordingly, it is important that body 5 retain charge carriers so as to preserve the stored value. To improve charge retention within body 5, body 5 is isolated from adjacent memory cells by oxides 9 and by other unshown oxides disposed in front of and behind the plane of FIG. 1. The isolating oxides may be fabricated using shallow trench isolation (STI) techniques.

FIG. 2 is a schematic diagram showing a 2×2 array of memory cells. It will be assumed that each of memory cells 10, 20, 30 and 40 is configured similarly to memory cell 1 of FIG. 1. The source of each memory cell is coupled to ground, the gate is coupled to a Word Line (WL), and the drain is coupled to a Bit Line (BL). According to conventional techniques, a "1" is written to a cell by applying a positive voltage to the gate via an appropriate Word Line, and by applying a positive voltage to the drain via an appropriate Bit Line. This biasing causes the cell to operate in saturation and thereby creates an impact ionization current that injects charge carriers into the body of the cell. The impact ionization current is depicted in FIG. 2 as a current source associated with each cell.

To write a "0", a positive voltage is applied to the gate via an appropriate Word Line and a negative voltage is applied to the drain via an appropriate Bit Line. Charge carriers are thereby ejected from the body to the drain. Ejection of the charge carriers is depicted as a body-to-drain diode associated with each cell of FIG. 2.

Applying a negative voltage via a Bit Line may inadvertently discharge other memory cells that are coupled to the Bit Line. In a specific example, memory cell 20 is discharged by applying a positive voltage to Word Line $WL_B$ and by applying a negative voltage to Bit Line $BL_A$. However, the negative voltage on Bit Line $BL_A$ may discharge the body of memory cell 10 even if Word Line $WL_A$ is "off". These inadvertent effects may be reduced in some implementations by precisely controlling the gate and drain voltages during a discharge and by increasing the gate-to-body coupling of each memory cell (e.g., by fabricating each transistor using Silicon On Insulator (SOI) techniques). Such implementations may be inefficient in terms of one or more of fabrication cost, die footprint, operational tolerances, and other factors.

DETAILED DESCRIPTION

Figure 3:
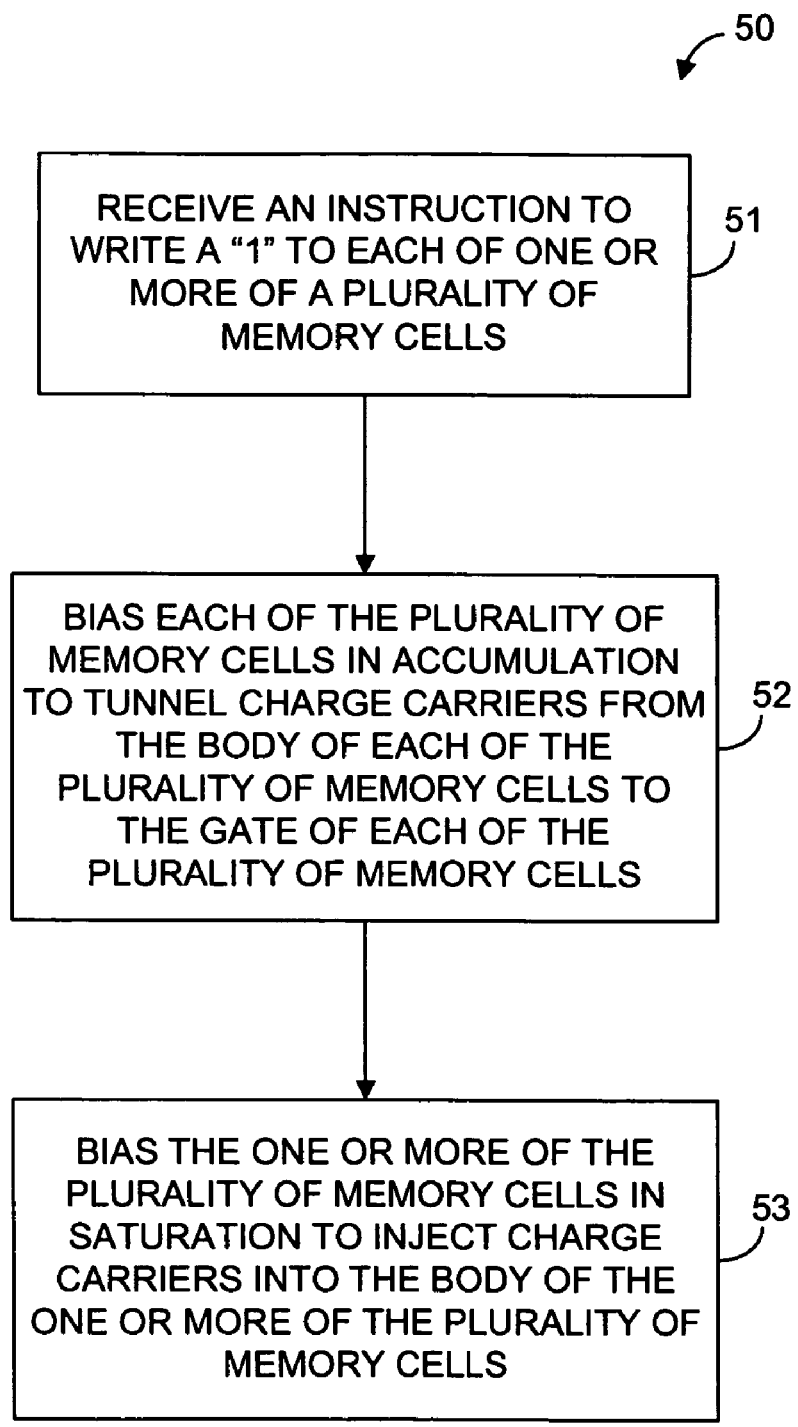
FIG. 3 is a flow diagram of a process according to some embodiments.

FIG. 3 is a flow diagram of process 50 according to some embodiments. Process 50 may be executed to write values to a plurality of memory cells. Process 50 may be performed by any combination of hardware, software, and/or firmware. According to some embodiments, process 50 is performed by hardware drivers executing stored code. The code may be stored on any suitable medium that is or becomes known.

Initially, at 51, an instruction is received to write a "1" to each of one or more of a plurality of memory cells. The instruction may be received by a memory including the memory cells. The instruction may specify the cells to which a "1" should be written.

Figure 1:
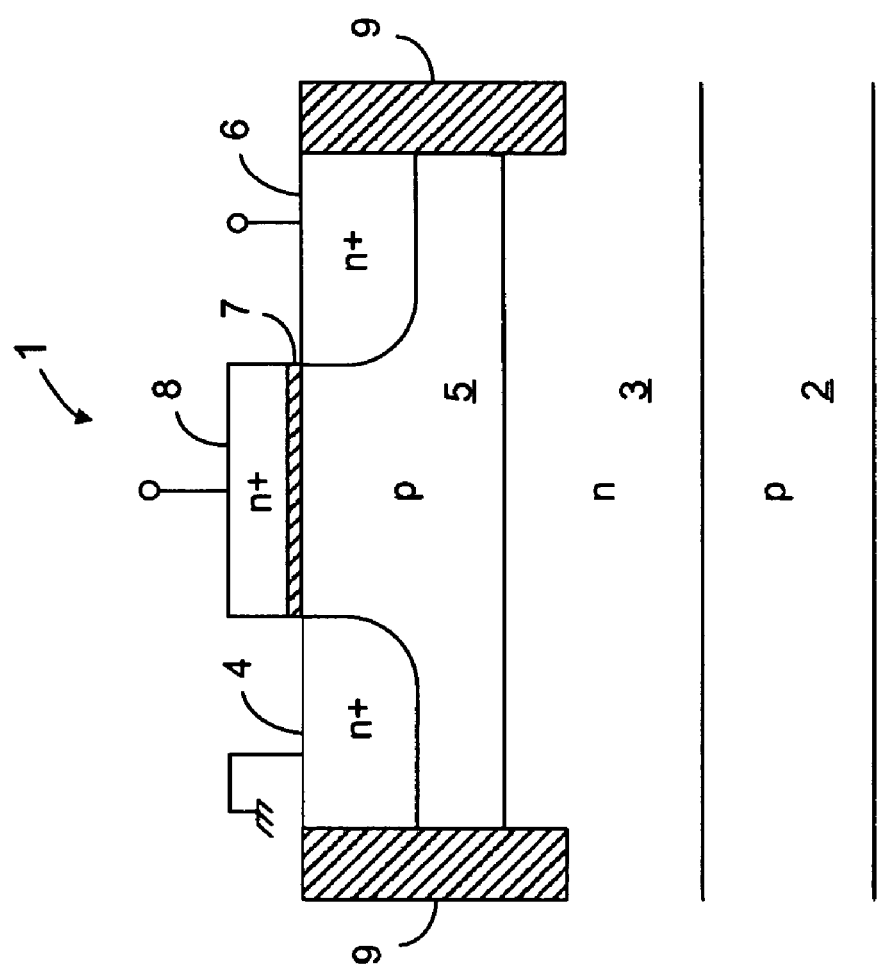
FIG. 1 is a cross-sectional view of an FBDRAM memory cell.
Figure 2:
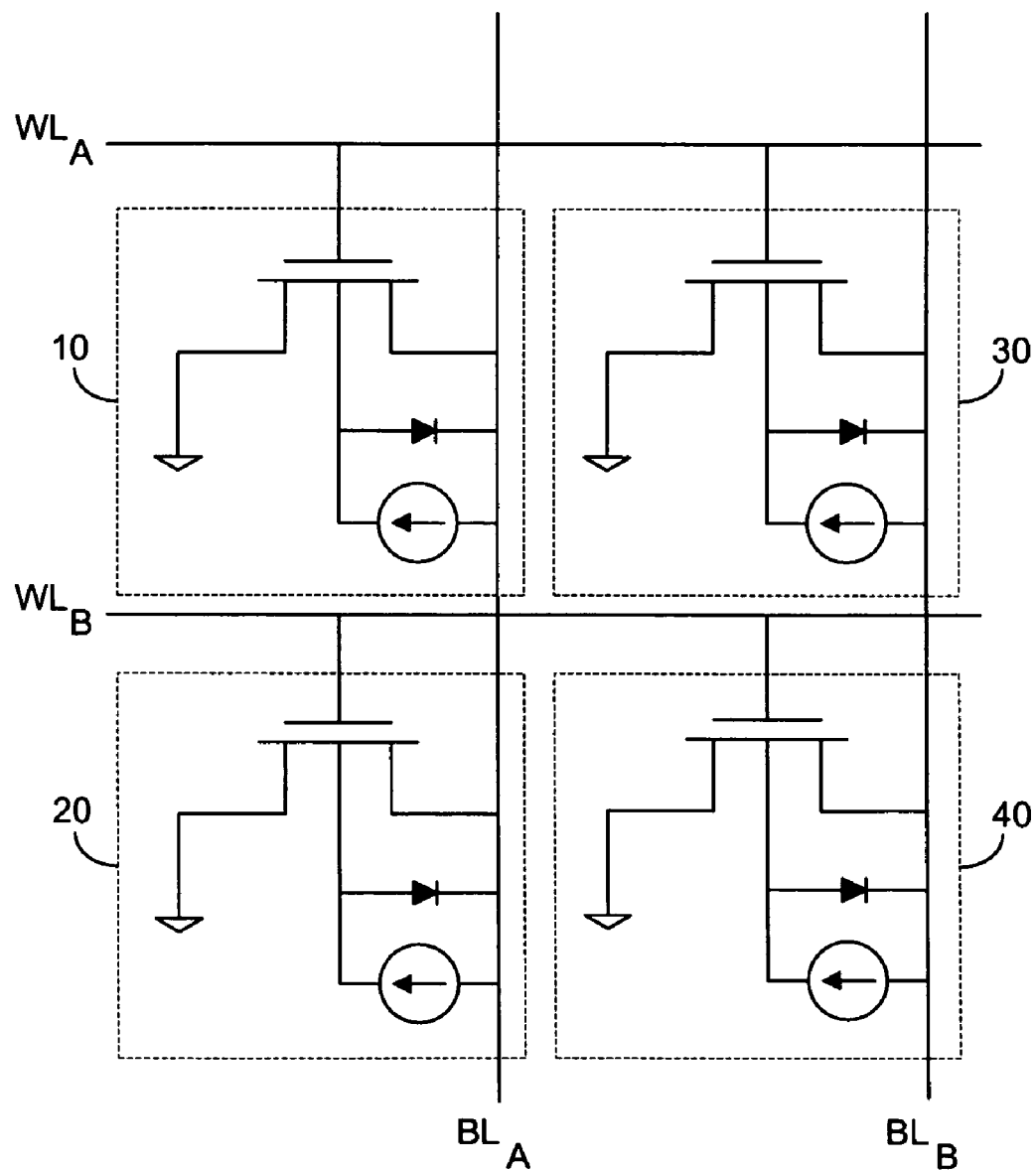
FIG. 2 is a schematic diagram of a memory cell array.
Figure 4:
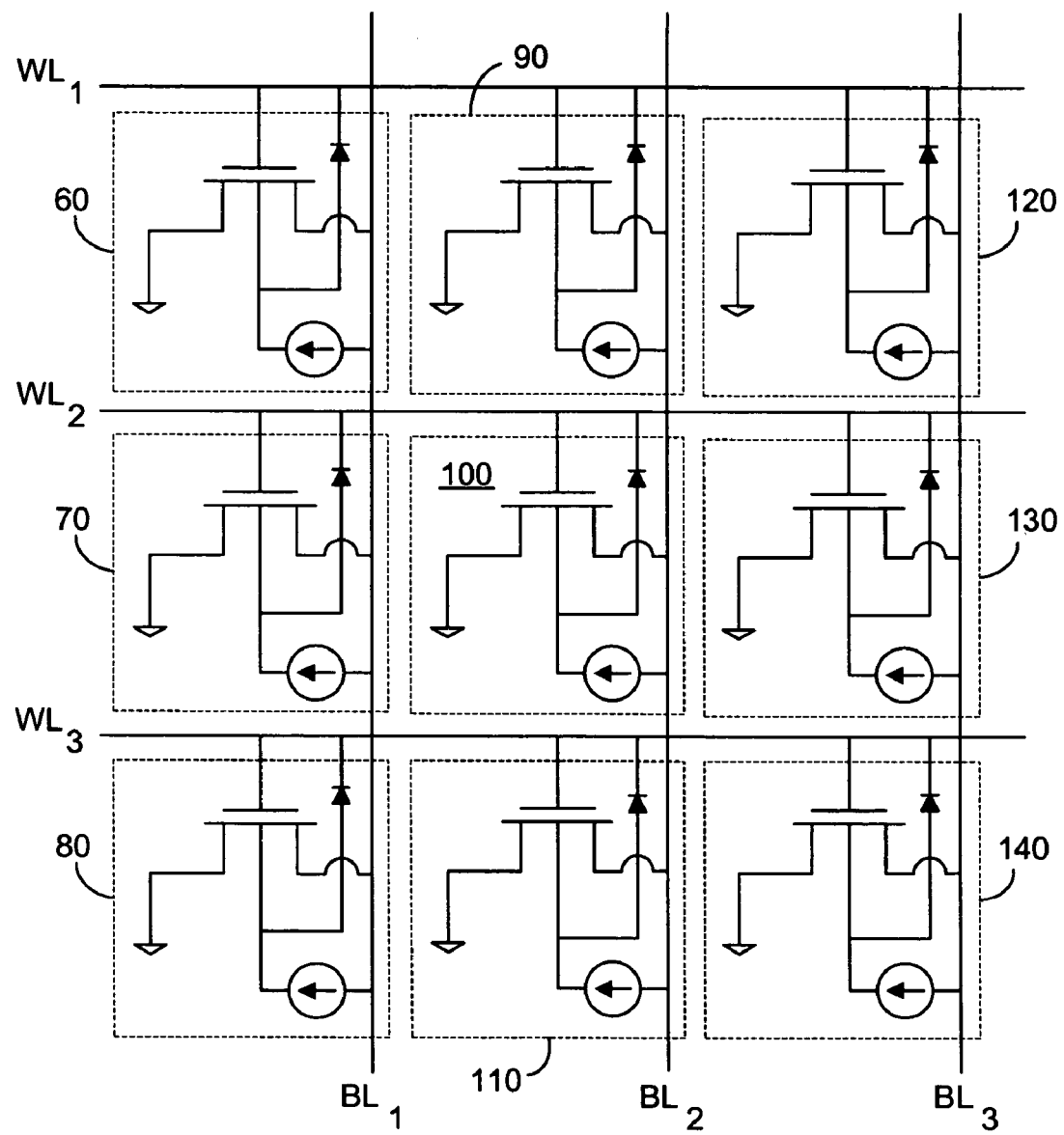
FIG. 4 is a schematic diagram of a memory cell array according to some embodiments.

FIG. 4 is a schematic diagram showing a 3×3 array of memory cells according to some embodiments. Each of memory cells 60 through 140 may be constructed as shown in FIG. 1. With reference to FIG. 1, substrate 2 of each of memory cells 60 through 140 may comprise any currently- or hereafter-known semiconductor substrate, including but not limited to silicon. As indicated by FIG. 1, substrate 2 is doped so as to include an excess of p-type charge carriers, or holes. Doping methods and materials used for each doped structure described herein may comply with any currently- or hereafter-known suitable methods and materials.

Source 4 and drain 6 are disposed within body 5, and are doped with an excess of n-type charge carriers. The concentration of charge carriers in source 4 and drain 6 is less than the concentration of charge carriers in well 3, as indicated by their respective "n+" and "n"designations. Oxide 7 is disposed over body 5 and n-type gate 8 is disposed thereon. Oxide 7 may comprise any suitable insulator, including but not limited to $SiO_2$, and gate 8 may comprise any conductor, including but not limited to doped polysilicon. Various layers of metallization and/or dielectric may be disposed above memory cell 1 according to some embodiments.

Returning to 51, an instruction may be received by a memory to write a "1" to cells 70 and 130 of FIG. 4. Flow then proceeds to 52, where each of memory cells 70, 100 and 130 is biased in accumulation to tunnel charge carriers from their bodies to their gates. Such biasing may include applying a suitable negative voltage to the gates of cells 70, 110 and 130 via Word Line $WL_2$. In some embodiments, the applied voltage is −1.1V.

Figure 5A:
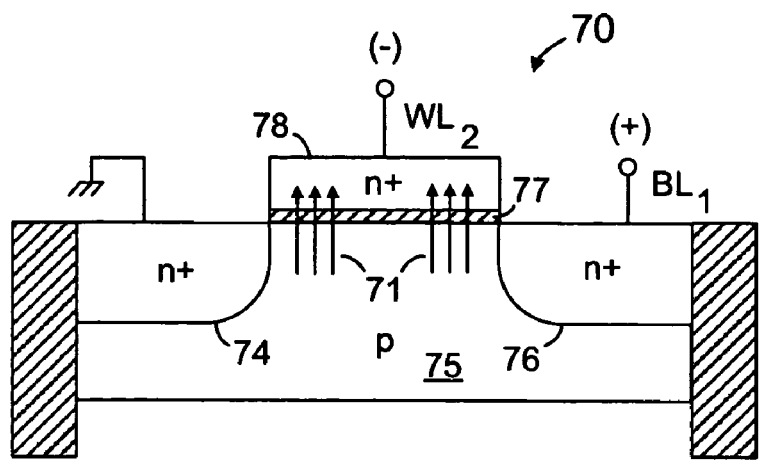
FIG. 5A is a cross-sectional view of a memory cell illustrating a write operation according to some embodiments.

FIG. 5A illustrates the biasing of memory cell 70 according to some embodiments of 52. As shown, the biasing causes charge carriers 71 to tunnel from body 75 to gate 78 through oxide 77. This tunneling is represented in FIG. 4 by a diode connecting the body and gate of each memory cell. Body 75 may be considered to store a value of "0" after 52, but other conventions may be used.

Next, at 53, the memory cells to be written are biased in saturation to inject charge carriers into their respective bodies. In some embodiments of 53, a positive voltage is applied to gates of memory cells 70 and 130 via Word Line $WL_2$, and a positive voltage is applied to drains of cells 70 and 130 via Bit Lines $BL_1$ and $BL_3$.

Figure 5B:
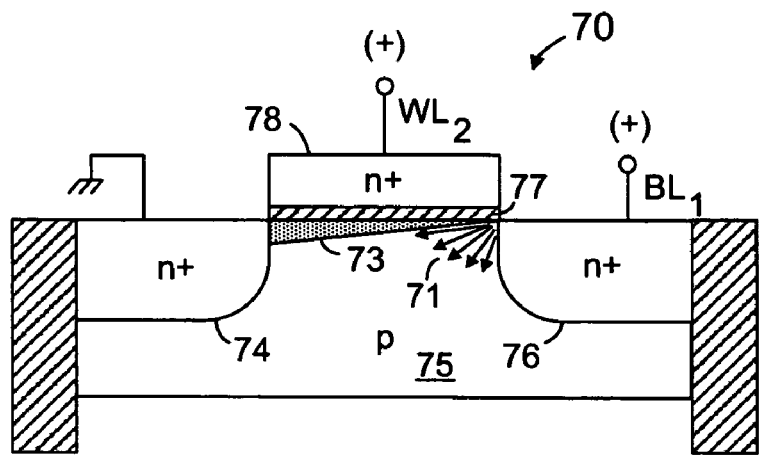
FIG. 5B is a cross-sectional view of a memory cell illustrating a write operation according to some embodiments.

FIG. 5B illustrates operation of memory cell 70 in saturation according to some embodiments of 53. The positive voltage on Word Line $WL_2$ causes channel 73 to develop beneath oxide 77. Channel 73 is "pinched off" at drain 76, so charge carriers 71 generated by the positive voltage on Bit Line $BL_1$ are injected to body 75. The injected charge carriers may represent a stored value of "1", but, again, other stored values may be represented by the carriers depending on the chosen convention.

Some embodiments of process 50 may provide more efficient manufacture and operation of a memory array than conventionally available. Process 50 may be performed with respect to any memory cell that uses a substantially isolated transistor body to store a value. Such memory cells may include p-type transistors, SOI-based transistors, and/or other transistor types. Those in the art will understand how to adapt the foregoing explanation for use in conjunction with other transistor types.

Figure 5C:
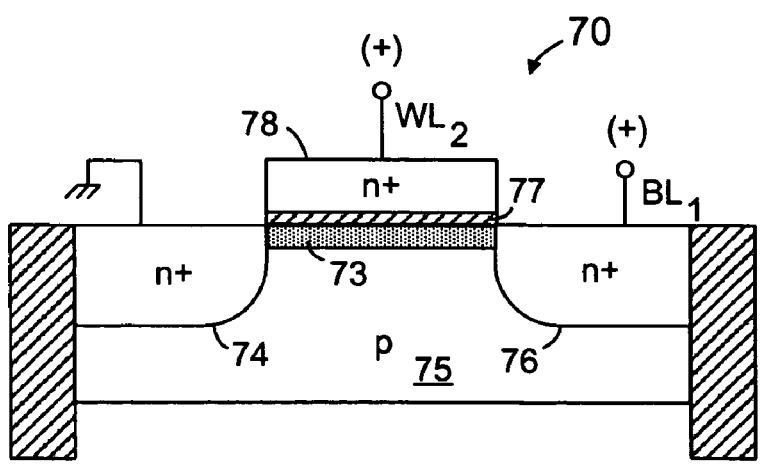
FIG. 5C is a cross-sectional view of a memory cell illustrating a read operation according to some embodiments.

For the sake of completeness, FIG. 5C illustrates reading a value from memory cell 70 according to some embodiments. For a given memory cell 70, a voltage on Bit Line $BL_1$ is less during operation according to FIG. 5C than during operation according to FIG. 5B. Channel 73 indicates that memory cell 70 is operating in a substantially linear operational region. When operated according to FIG. 5C, memory cell 70 develops a drain current that is based at least in part on a concentration of charge carriers within body 75. The concentration of charge carriers may therefore be determined based on the drain current. In some embodiments, the drain current is higher for a higher concentration of charge carriers (e.g., representing a stored "1" value), and lower for a lower concentration of charge carriers (e.g., representing a stored "0" value).

Figure 6A:
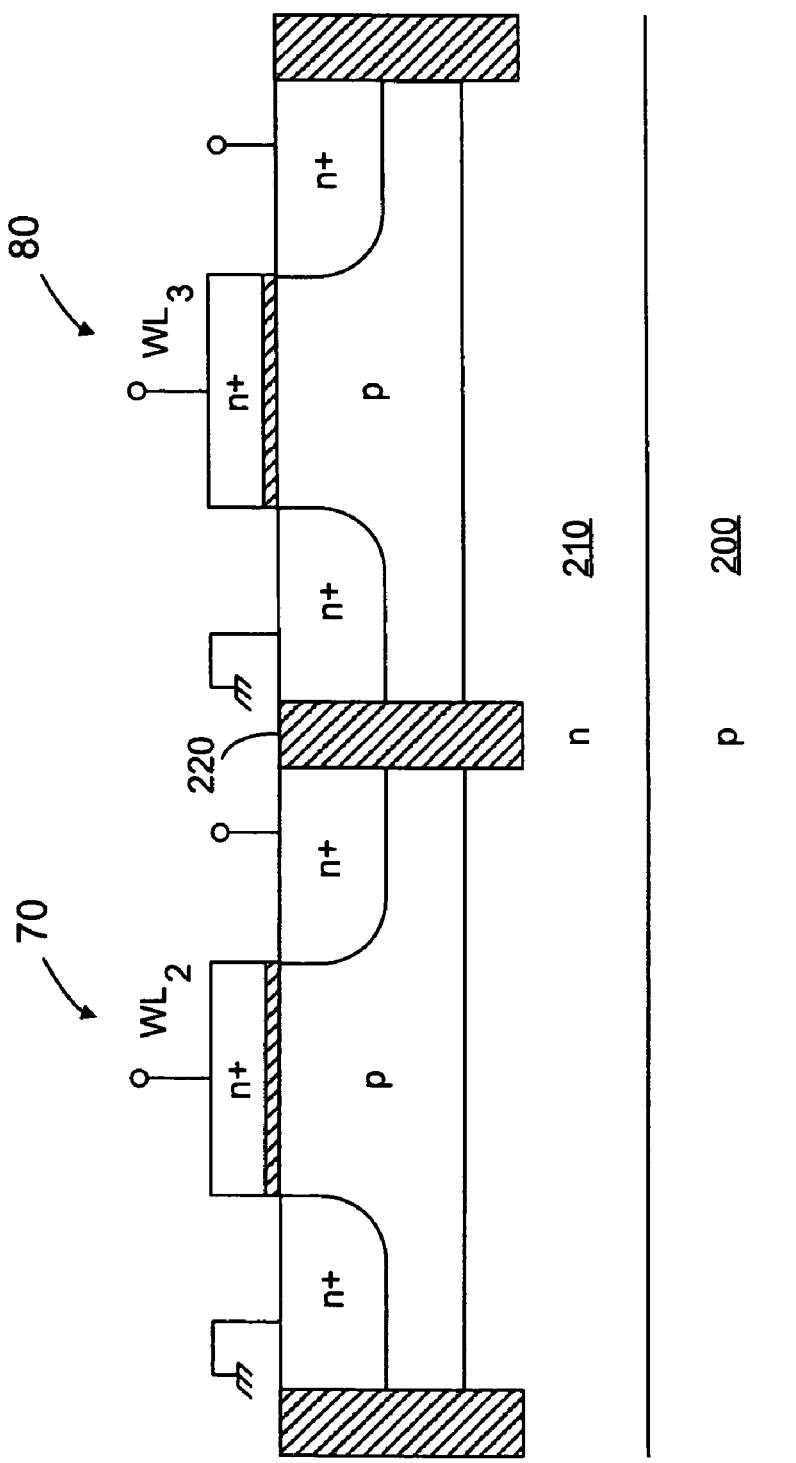
FIG. 6A is a cross-sectional view of memory cells according to some embodiments.

FIG. 6A is a cross-sectional side view of memory cells 70 and 80 that may be used in conjunction with some embodiments. Memory cells 70 and 80 are disposed adjacent to one another within substrate 200 and well 210. Memory cells 70 and 80 are constructed as described above, and are separated laterally by oxide 220. Oxide 220 may be fabricated prior to cells 70 and 80 using known STI techniques, and provides isolation between the bodies of cells 70 and 80. The bodies of memory cells 70 and 80 may be isolated from other cells located in front of and behind the plane of FIG. 6A using other unshown oxide in an STI arrangement.

Figure 6B:
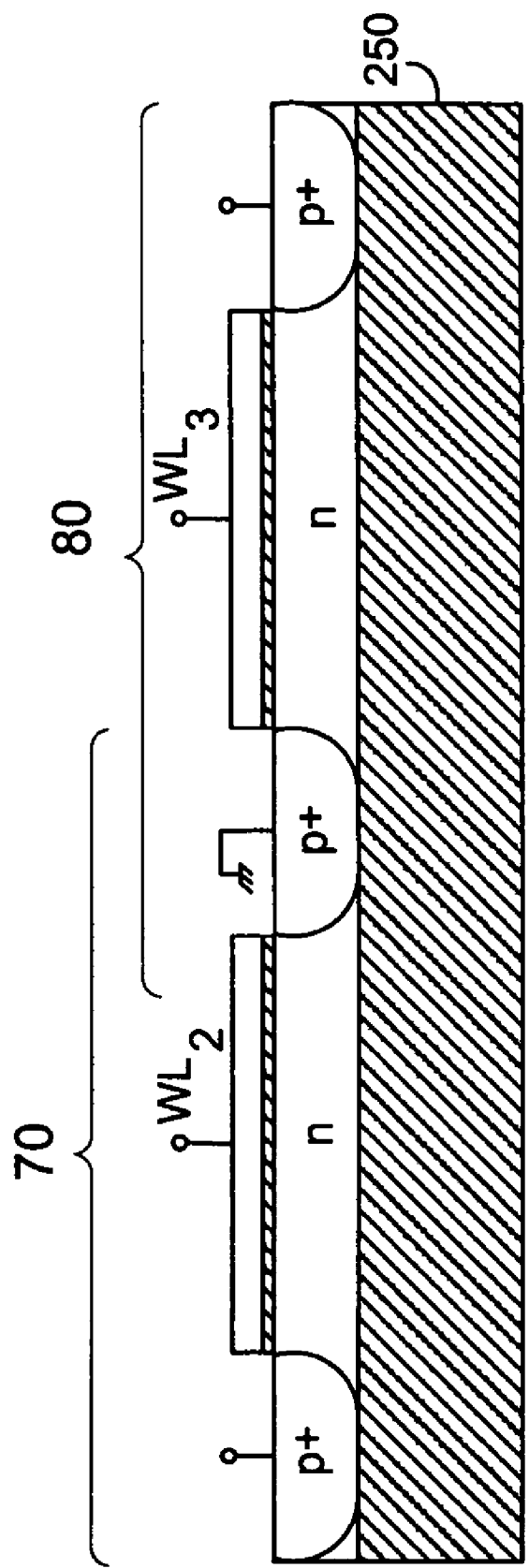
FIG. 6B is a cross-sectional view of memory cells according to some embodiments.

FIG. 6B is a cross-sectional side view of memory cells 70 and 80 according to some embodiments. Memory cells 70 and 80 are fabricated upon oxide 250 in an SOI arrangement. Oxide 250 isolates the bodies of cells 70 and 80 from each other, and allows adjacent cells to share a common source. The bodies are also isolated in front of and behind the plane of FIG. 6B using STI techniques.

Figure 7:
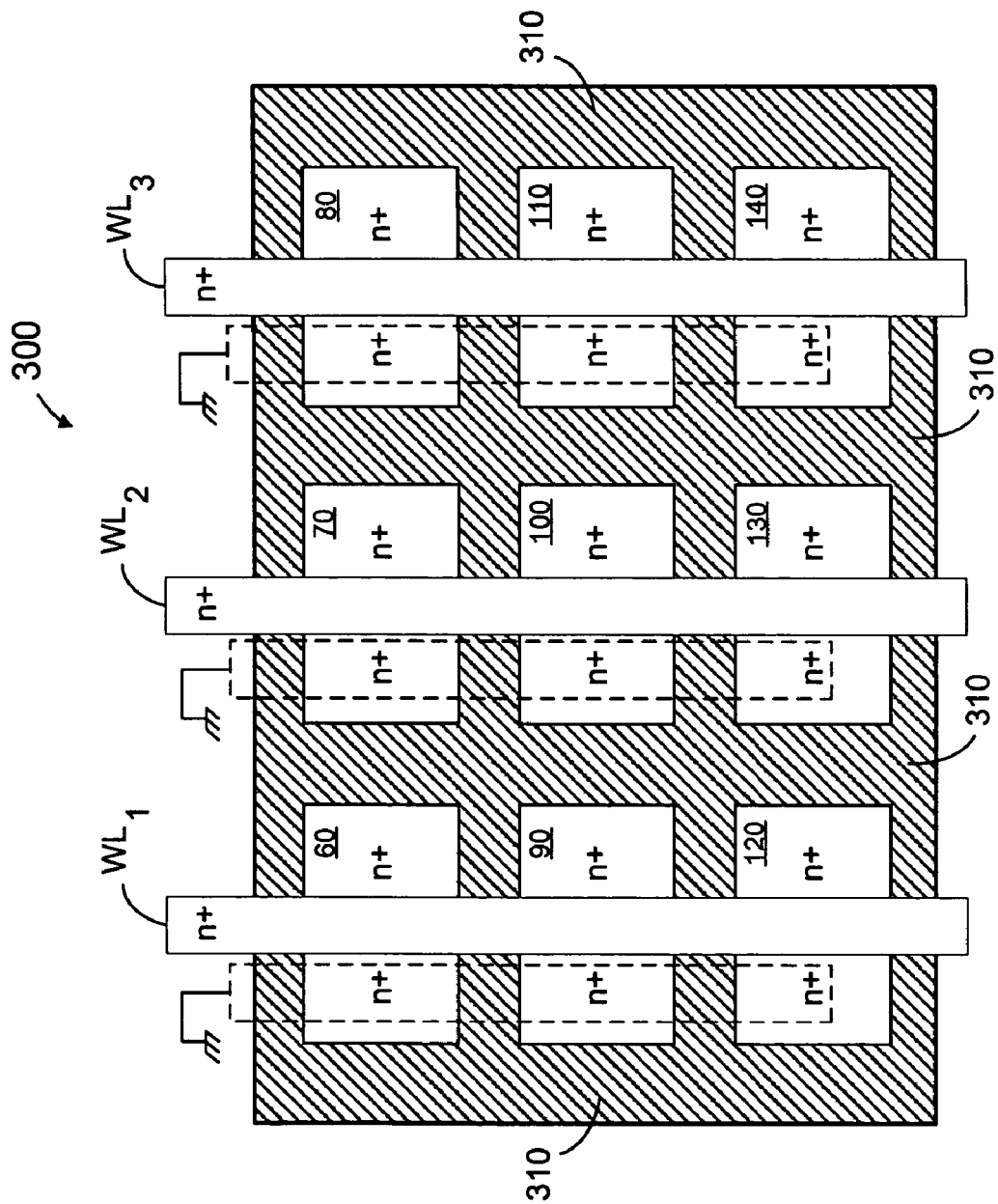
FIG. 7 is a top view of a memory cell array according to some embodiments.

FIG. 7 is a top view of memory cell array 300 according to some embodiments. Memory cell array 300 includes memory cells 60 through 140 of FIG. 4. Oxides trenches 310 serve to isolate each cell from its neighbors. More particularly, trenches 310 separate the body of each memory cell from the body of each other memory cell. Such separation may improve charge retention within the respective bodies.

Word lines $WL_1$, $WL_2$ and $WL_3$ are shown coupled to the gates of three cells as shown in FIG. 4. Similarly, the sources of each memory cell are coupled to ground. Bit Lines $BL_1$, $BL_2$ and $BL_3$ have been omitted for clarity, however, in some embodiments, the Bit Lines run perpendicular to and above the Word Lines, and are coupled to appropriate memory cell drains using vias or the like.

Figure 8:
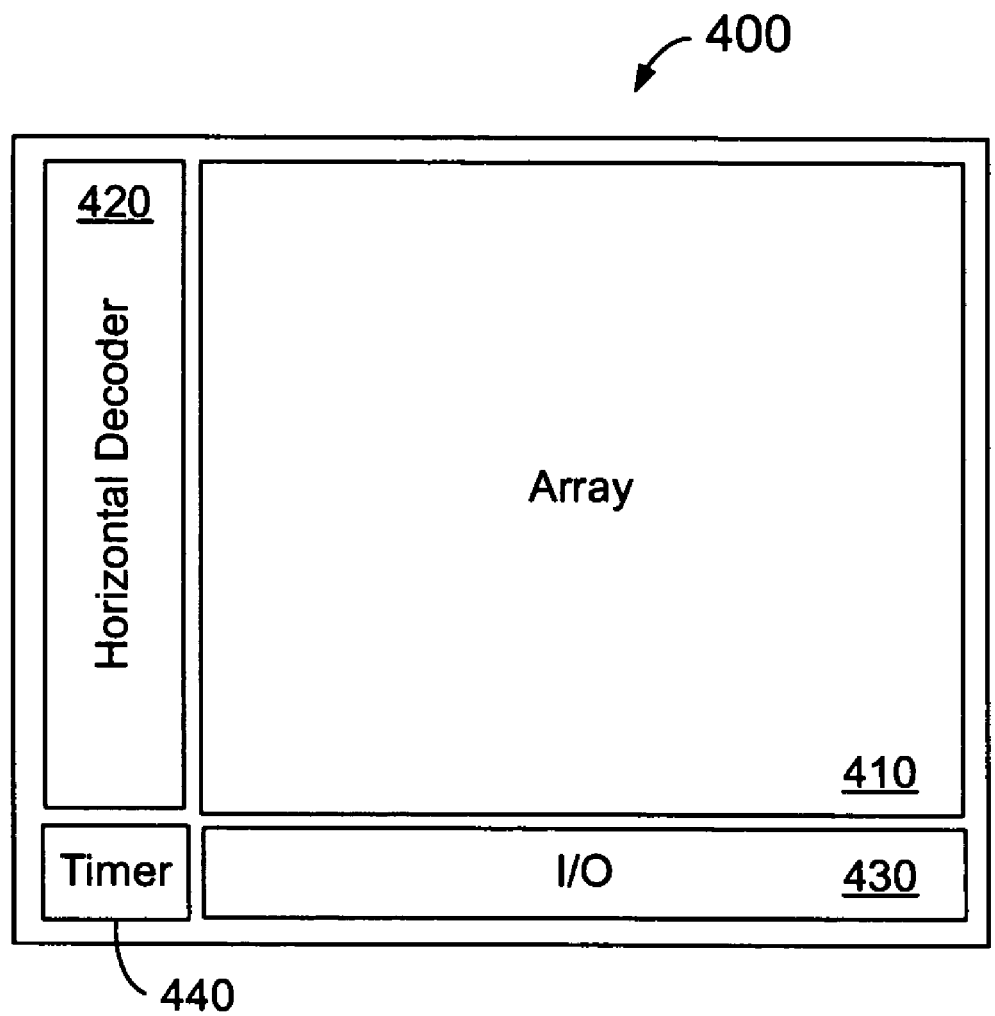
FIG. 8 is a block diagram of a memory according to some embodiments.

FIG. 8 is a block diagram of memory 400 according to some embodiments. Memory 400 includes memory cell array 410, horizontal decoder 420, I/O unit 430 and timer 440. Memory cell array 410 may include many memory cells such as those shown in FIGS. 1, 5, 6A and/or 6B. For example, a 32 kB memory array may include 256 columns of 128 memory cells each.

Horizontal decoder 420 may execute code to apply voltages to the gate and drain of memory cells in memory cell array 410 according to process 50. I/O unit 430 may include devices to read values stored by the memory cells. In this regard, timer 440 may provide suitable timing for the signals described herein.

Figure 9:
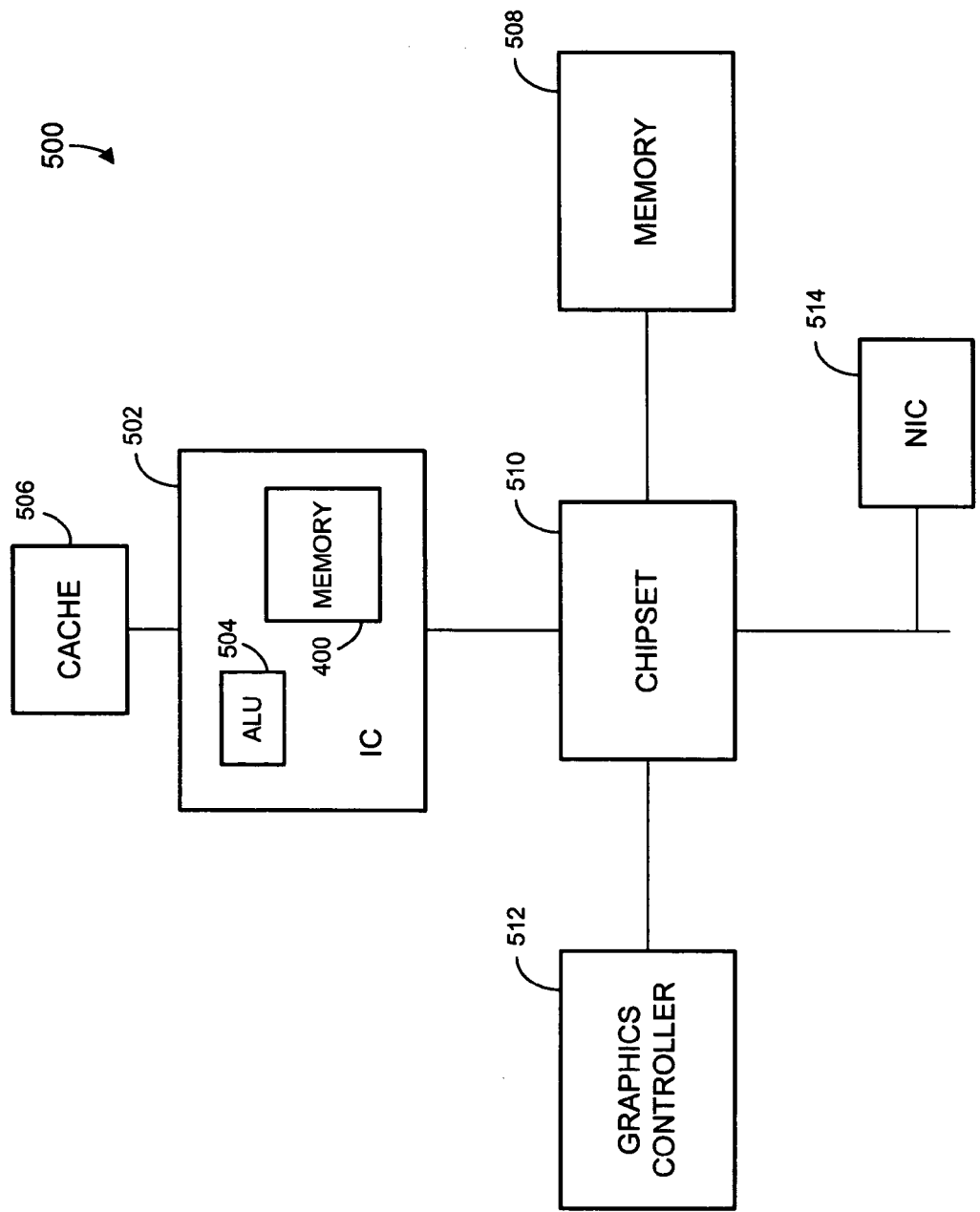
FIG. 9 is a block diagram of a system according to some embodiments.

FIG. 9 illustrates a block diagram of system 500 according to some embodiments. System 500 includes integrated circuit 502 comprising sub-blocks such as arithmetic logic unit (ALU) 504 and memory 400, which serves as an on-die cache. Integrated circuit 502 may be a microprocessor or another type of integrated circuit. Integrated circuit 502 communicates with off-die cache 506 according to some embodiments. Off-die cache 506 may also comprise a memory such as memory 400. Integrated circuit 502 may communicate with system memory 508 via a host bus and chipset 510. System memory 508 may comprise any type of memory for storing data, such as a Single Data Rate Random Access Memory, a Double Data Rate Random Access Memory, or a Programmable Read Only Memory. Other off-die functional units, such as graphics controller 512 and Network Interface Controller (NIC) 514, may communicate with integrated circuit 502 via appropriate busses or ports.

The several embodiments described herein are solely for the purpose of illustration. Embodiments may include any currently or hereafter-known versions of the elements described herein. Therefore, persons in the art will recognize from this description that other embodiments may be practiced with various modifications and alterations.

What is claimed is:

1. A method to write to a plurality of memory cells coupled to a word line, each of the plurality of memory cells comprising a transistor having a source, a drain, a body and a gate coupled to the word line, the method comprising:

biasing each of the plurality of memory cells in accumulation to tunnel charge carriers from the body of each of the plurality of memory cells to the gate of each of the plurality of memory cells; and biasing one or more of the plurality of memory cells in saturation to inject charge carriers into the body of the one or more of the plurality of memory cells.

2. A method according to claim 1, wherein biasing the one or more of the plurality of memory cells in saturation comprises:

applying a gate voltage to the gate of each of the plurality of memory cells to create an inversion layer between the source and the drain of each of the plurality of memory cells; and applying a drain voltage to the drain of each of the plurality of memory cells.

3. A method according to claim 2, wherein each drain of the one or more of the plurality of memory cells is coupled to a respective bit line, and wherein applying the drain voltage comprises:

applying the drain voltage to each of the respective bit lines.

4. A method according to claim 1, further comprising:

receiving an instruction to write a "1" to each of the one or more of the plurality of memory cells.

5. A medium storing executable code, the code executable to write to a plurality of memory cells coupled to a word line, each of the plurality of memory cells comprising a transistor having a source, a drain, a body and a gate coupled to the word line, the code comprising:

code to bias each of the plurality of memory cells in accumulation to tunnel charge carriers from the body of each of the plurality of memory cells to the gate of each of the plurality of memory cells; and code to bias one or more of the plurality of memory cells in saturation to inject charge carriers into the body of the one or more of the plurality of memory cells.

6. A medium according to claim 5, wherein the code to bias the one or more of the plurality of memory cells in saturation comprises:

code to apply a gate voltage to the gate of each of the plurality of memory cells to create an inversion layer between the source and the drain of each of the plurality of memory cells; and code to apply a drain voltage to the drain of each of the plurality of memory cells.

7. A medium according to claim 6, wherein each drain of the one or more of the plurality of memory cells is coupled to a respective bit line, and wherein the code to apply the drain voltage comprises:

code to apply the drain voltage to each of the respective bit lines.

8. A medium according to claim 5, the code further comprising:

code to receive an instruction to write a "1" to each of the one or more of the plurality of memory cells.

9. A system comprising:

a microprocessor comprising a plurality of memory cells coupled to a word line, each of the plurality of memory cells comprising:

a transistor having a source, a drain, a body and a gate coupled to the word line; and a double data rate memory coupled to the microprocessor, wherein the microprocessor is operable to bias one or more of the plurality of memory cells in saturation to inject charge carriers into the body of the one or more of the plurality of memory cells, and bias each of the plurality of memory cells in accumulation to tunnel charge carriers from the body of each of the plurality of memory cells to the gate of each of the plurality of memory cells.

10. A system according to claim 9, wherein biasing the one or more of the plurality of memory cells in saturation comprises:

applying a gate voltage to the gate of each of the plurality of memory cells to create an inversion layer between the source and the drain of each of the plurality of memory cells; and applying a drain voltage to the drain of each of the plurality of memory cells.

11. A system according to claim 10, wherein each drain of the one or more of the plurality of memory cells is coupled to a respective bit line, and wherein applying the drain voltage comprises:

applying the drain voltage to each of the respective bit lines.

12. A system according to claim 9, wherein the microprocessor is further operable to receive an instruction to write a "1" to each of the one or more of the plurality of memory cells.

* * * * *